(12) United States Patent
Okamoto et al.

(10) Patent No.: US 7,684,208 B2
(45) Date of Patent: Mar. 23, 2010

(54) ADAPTER BLADE FOR A BLADE SERVER SYSTEM CHASSIS

(75) Inventors: Michihiro Okamoto, Kawasaki (JP); Edward Stanley Suffern, Chapel Hill, NC (US); Takeshi Wagatsuma, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 11/693,416

(22) Filed: Mar. 29, 2007

(65) Prior Publication Data

US 2008/0239689 A1 Oct. 2, 2008

(51) Int. Cl.
H05K 7/14 (2006.01)

(52) U.S. Cl. .................. 361/798; 361/754; 361/759; 361/801

(58) Field of Classification Search .......... 361/754, 361/798, 796, 788, 740, 732, 747, 801, 759; 312/223.2, 223.3
See application file for complete search history.

(56) References Cited

U.S. PATENT DOCUMENTS

| | | | |
|---|---|---|---|
| 4,821,145 A * | 4/1989 | Corfits et al. ............... | 361/692 |
| 6,252,514 B1 * | 6/2001 | Nolan et al. .............. | 340/686.4 |
| 6,421,252 B1 | 7/2002 | White et al. | |
| 6,580,616 B2 | 6/2003 | Greenside et al. | |
| 6,603,657 B2 * | 8/2003 | Tanzer et al. ........... | 361/679.33 |
| 6,606,256 B1 | 8/2003 | Lee et al. | |
| 6,831,832 B2 | 12/2004 | Haager et al. | |
| 2002/0135987 A1 | 9/2002 | Baldwin et al. | |

* cited by examiner

*Primary Examiner*—Dameon E Levi
(74) *Attorney, Agent, or Firm*—Cynthia G. Seal; Jeffrey L. Streets

(57) ABSTRACT

A system chassis includes multiple chassis bays configured for receiving either of a single, conventional server blade or an adapter blade. The adapter blade can selectively secure a plurality of compact blades, such as a blade PC. The adapter blade includes a blade latch for selectively releasing the adapter blade from the chassis bay, wherein the presence of a compact blade enclosure within any of the plurality of adapter bays of the adapter blade prevents the latch from being operable to release the adapter blade. The compact blade preferably includes a latch disposed along an upper or lower edge of the blade for selectively releasing the compact blade enclosure from the adapter bay. The adapter blade preferably also includes an interposer disposed for electronically communicating each compact blade with a server interface a separate node upon securing a compact blade within any of the adapter bays.

12 Claims, 8 Drawing Sheets

ADAPTER BLADE FOR A BLADE SERVER SYSTEM CHASSIS

BACKGROUND OF THE INVENTION

1. Field of the Invention

The present invention relates to an apparatus for efficiently storing and operating computer components, such as a blade server and a blade PC.

2. Description of the Related Art

Multiple computer servers are often consolidated into a data center and mounted in a chassis to make efficient use of space. Accordingly, the servers and infrastructure are placed within easy reach of an administrator. The IBM eServer BladeCenter is one example of a compact server arrangement (IBM and BladeCenter are registered trademarks of International Business Machines Corporation, Armonk, N.Y.). A blade server chassis typically has multiple bays which receive and secure blade servers. The server bays are typically made according to standardized dimensions in order to securely and operationally receive the blade server. For example, a standardized 19-inch chassis may accommodate multiple "1U" (one unit) blade server having a width of 1.75 inches (44.45 mm).

A latching mechanism is used to secure a server blade within a bay of the chassis. The latching mechanism includes a release lever that is operated by a user to allow a blade server to be removed from a bay where it has been previously installed. Relatively large release levers are conventionally mounted on one side of the blade server near an end that is positioned at the front of each bay. The design of the release levers is constrained by the dimensions of the blade server and the dimensions of the bay. If a release lever is too large, it can undesirably reduce space available for server components and may pose at least some airflow restrictions. If the release lever is too small, it may present usability issues, such as providing insufficient physical access or leverage.

Accordingly, there remains a need for improved methods and apparatus for securing and managing computer components, such a blade servers. It would be desirable to have an apparatus that was easy to use without restricting air flow. It would also be desirable if the apparatus provided flexibility in the types of computer components that could be installed, while preventing inappropriate installation or release of those components.

SUMMARY OF THE INVENTION

The present invention provides an apparatus comprising a system chassis having a plurality of chassis bays, wherein each chassis bay is configured for selectively securing a blade. An adapter blade is configured to be selectively secured within any of the plurality of chassis bays, wherein the adapter blade includes a plurality of adapter bays, and wherein each adapter bay is configured for selectively securing a compact blade. A blade latch is provided for selectively releasing the adapter blade from the chassis bay, wherein the presence of a compact blade within any of the plurality of adapter bays of the adapter blade prevents the latch from being operable to release the adapter blade.

Preferably, the blade latch is disposed along an upper or lower edge of the blade. Furthermore, the blade latch may include a lever pivotally secured to the adapter blade and a mating latch element on the system chassis, wherein some portion of the lever must enter into an empty adapter bay in order for the lever to release from the mating latch element so that the adapter blade can be removed from the chassis bay. Optionally, the lever includes a projecting member and the mating latch element is a slot. Most preferably, the adapter blade includes both a blade latch disposed along an upper edge of the adapter blade and a blade latch disposed along a lower edge of the adapter blade.

The apparatus may also include a server interface, such as a midplane or backplane, disposed for electronic communication with a server blade upon securing the server blade within the chassis bay. An interposer may be included in the adapter blade and disposed for electronic communication with a compact blade upon securing a compact blade within any of the adapter bays. The interposer electronically communicates each compact blade with the server interface as a separate node. The compact blade is preferably a blade PC, a companion card to a blade PC, or a blade server.

Other embodiments, aspects, and advantages of the invention will be apparent from the following description and the appended claims.

DETAILED DESCRIPTION OF EMBODIMENTS

The present invention provides a system chassis having multiple bays. Each chassis bay is configured for receiving either a single, conventional server blade or an adapter blade which is itself configured for receiving a plurality of compact blades. Preferably, each of the plurality of compact blades may be configured as a different node of a processing system. Thus, a plurality of compact blades may now be installed in a chassis bay that is compatible with or designed for a single conventional server blade. A number of different useful and advantageous configurations of the system chassis may be achieved. For example, a compact blade may be configured as a server, allowing two or more servers to fit into a single chassis bay. Alternatively, a compact blade may be configured as a "client blade" or "blade PC," effectively replacing a local desktop PC with a rack-mountable blade PC. Thus, two or more of the blade PCs, or other compact blade type, may now be installed in a single server bay. If one of the compact blades disposed in an adapter bay is configured as a blade PC, then another compact blade disposed in an adapter bay of the same adapter blade may be configured as a companion card to the blade PC.

One embodiment includes a system chassis having a plurality of chassis bays, each chassis bay being configured for receiving and securing a blade. Specifically, each bay can selectively secure either of a conventional server blade or an adapter blade. The adapter blade can selectively secure a plurality of compact blades. Preferably, the adapter blade in selectively secured in the bay using an adapter blade latch. One or more of the compact blades may then be inserted into the adapter blade. A blade latch is preferably also provided for selectively securing each individual compact blade in the adapter blade. The presence of a compact blade in the adapter blade interferes with movement of an adjacent chassis latch to prevent the adapter blade from being inadvertently removed from the system chassis while the compact blades are secured in an adapter bay.

The system chassis also prevents a user from inadvertently operating the "wrong" release mechanism. For example, a user intending to remove an individual compact blade using the release lever (rather than the adapter blade latch) will be unsuccessful. The system chassis further prevents the user from operating the system chassis in the incorrect sequence. For example, the computer system may be damaged or corrupted if the adapter blade were removed while the compact blades are in electronic communication with other components of the computer system. Because the adapter blade latch cannot be released with the compact blades installed, the user must first disconnect both of the compact blades before unlatching and removing the adapter blade.

Figure 1:
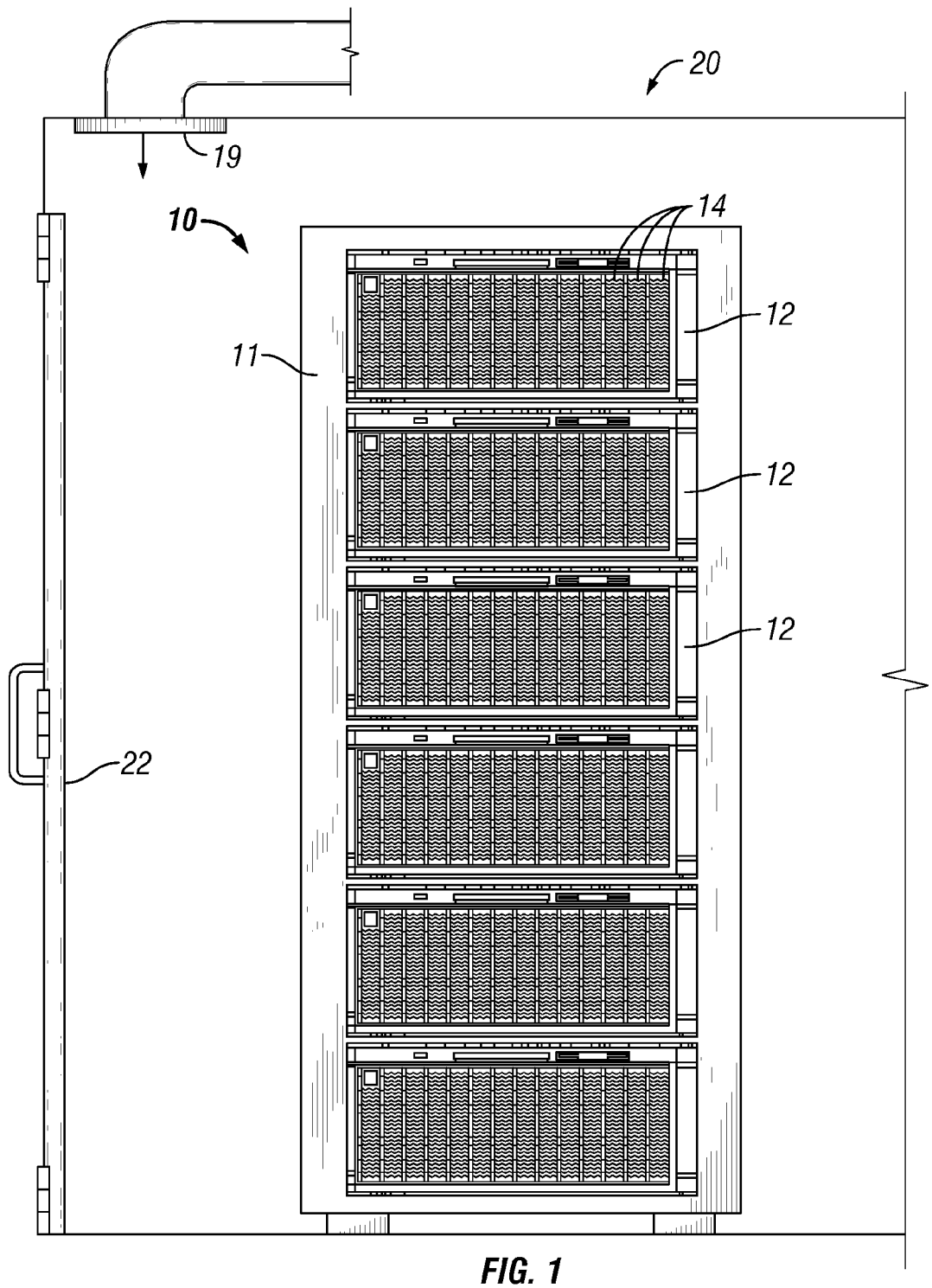
FIG. 1 is a partial front view of a data center housing a plurality of blade server system chassis.

FIG. 1 is a front view of a data center 20 housing a rack system 10. The data center 20 includes a ventilation system 19 and other resources for controlling environmental parameters, such as temperature and humidity, for proper functioning of the rack system 10. The data center 20 is accessible by a system administrator through an entryway 22. The rack system 10 includes a rack 11 supporting six enclosures 12. A plurality of server blades 14 are slidably, removably disposed within each system chassis 12. Additional rack systems supporting additional system chassis may also be located in the data center 20. The rack system 10 provides an organized, efficient, and high-density arrangement for the many server blades 14. The server blades 14 are typically coupled through one or more networks to collectively provide a robust processing system. The data center 20 may be maintained, for example, by an organization for the purpose handling the data used in its operations. The data center 20 may provide a wide variety of services and functionality to a community of users, such as to employees in an office building who are connected to the server blades 14 in the rack system 10 via a LAN and/or to users more remotely networked via the Internet.

Figure 2:
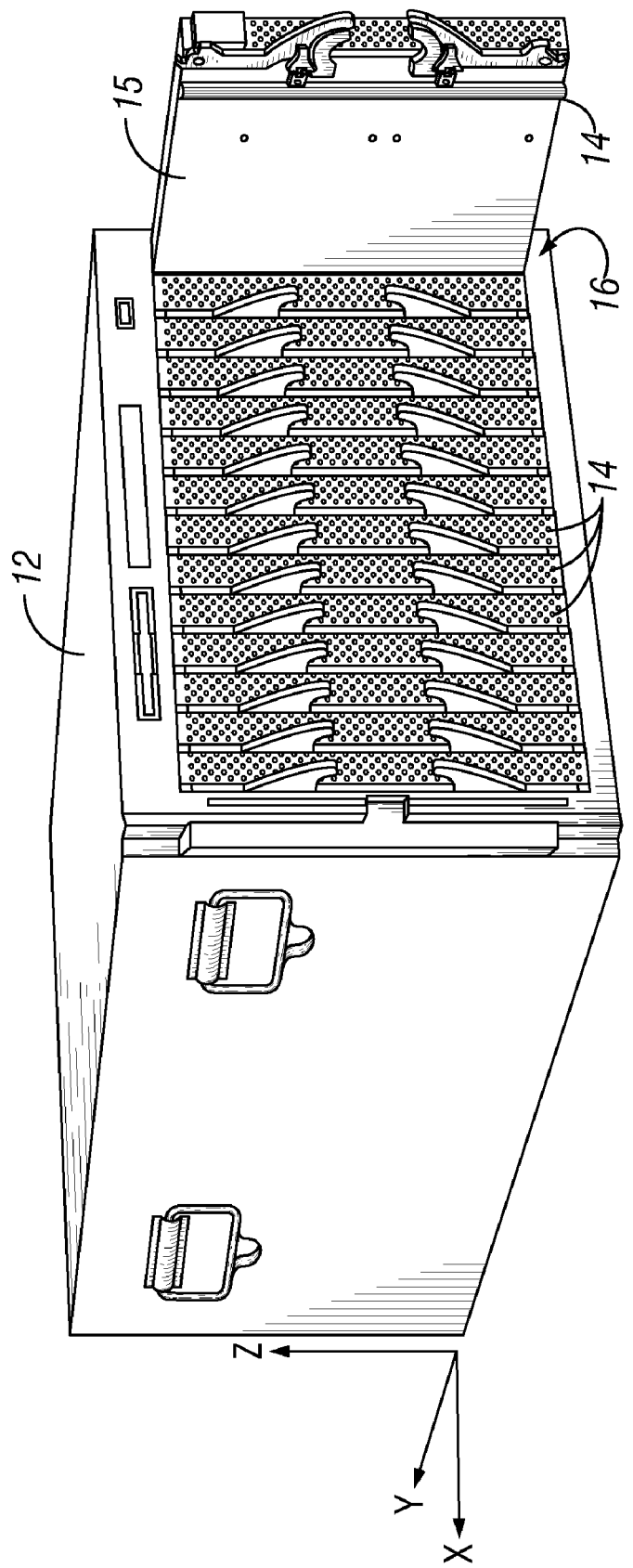
FIG. 2 is a perspective view of a blade server chassis with a number of blade servers slidably inserted within bays formed in the chassis.

FIG. 2 is a perspective view of one of the system chassis 12 with server blades 14 slidably inserted. The server blades 14 are selectively secured in the system chassis 12 and are typically networked, although the topology may vary greatly as known in the art. One server blade 14 is shown only partially received in a bay 16. The server blade 14 includes an individual server blade enclosure 15 that houses a processor complex, including one or more CPUs, memory modules, PCI cards, fans, and hard drives. With reference to translational coordinate axes (x, y, and z) in FIG. 2, the bay 16 substantially constrains the server blade 14, in terms of lateral (x-axis) translation and vertical (z-axis) translation, but is moveable by the user in a y-axis direction, into and out of the bay 16. The bay 16 also constrains the server blade 14 rotationally, fixing its orientation in a substantially parallel relationship with adjacent server blades 14. Thus, the system chassis 12 constrains the server blades 14 at a fixed spacing and with face-to-face alignment. Depending on how tightly the server blade 14 fits in the bay 16, there may be a slight degree of lateral, vertical, or rotational "play" between the server blade 14 and the bay 16, without appreciably affecting the generally fixed spacing and parallel alignment of the server blades 14.

Figure 3:
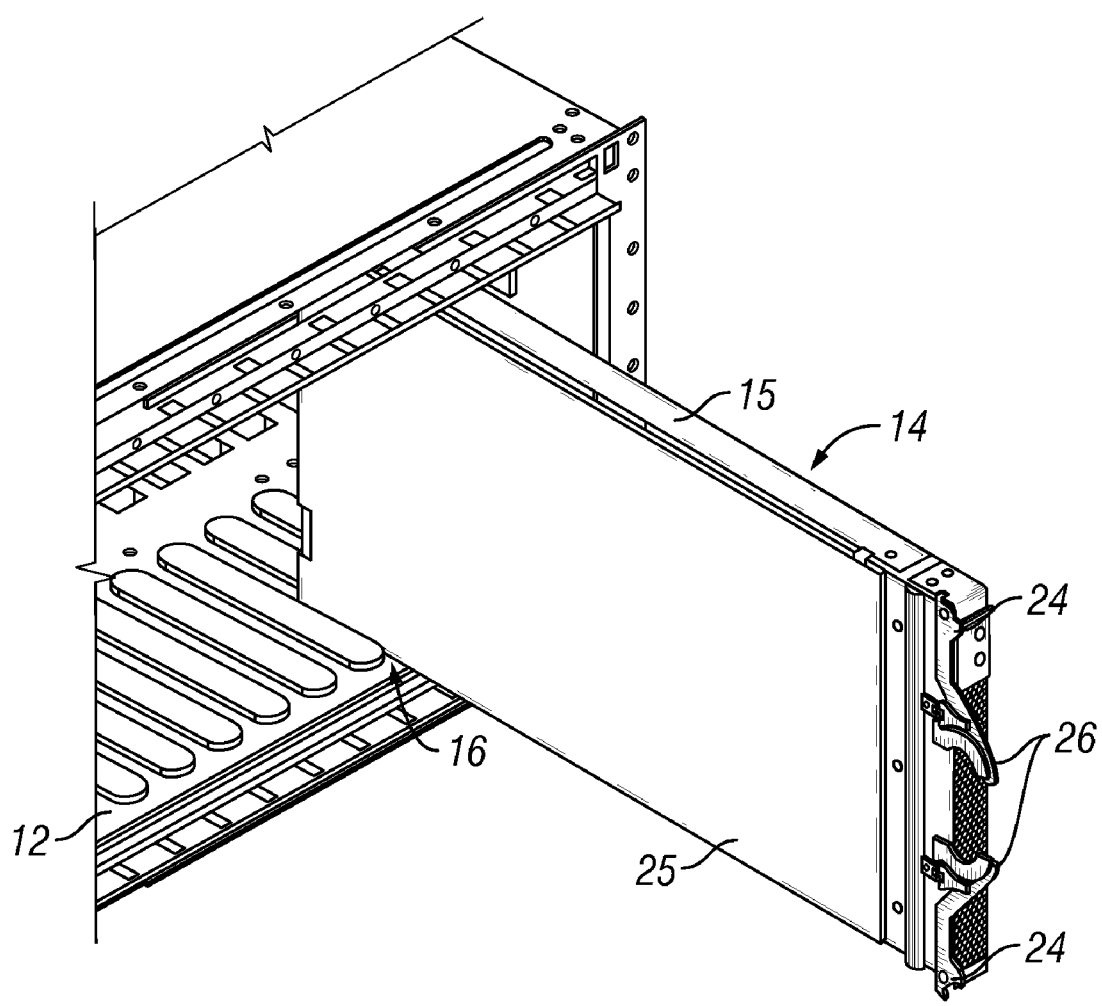
FIG. 3 is a perspective view of a conventional blade server removed from the bay of FIG. 2.

FIG. 3 is a perspective view of the conventional server blade 14 removed from the bay 16 of FIG. 2. The server blade 14 may be secured within the bay 16 using a latch 24 known in the art. The latch 24 includes a release lever 26 on a longitudinal side 25 of the server blade enclosure 15. When disposed in the bay 16, the server blade 14 is connected in electronic communication with a server interface (not shown). This connection is typically made via connectors formed on the end of the blade 14 that leads into the bay. The server interface allows the server blade 14 to interface with a processing system or network as a node, typically in conjunction with the support of a server operating system and other network hardware and software. In networking, a node may be generally described as a network device having its own processing location. Every node has a unique network address, such as a Data Link Control (DLC) address or Media Access Control (MAC) address. A node in the context of this embodiment is typically a server blade, compact blade or other hardware device having a processor complex, such as a client blade or client blade companion card, although other network devices such as a printer may also be configured as a node.

Figure 4:
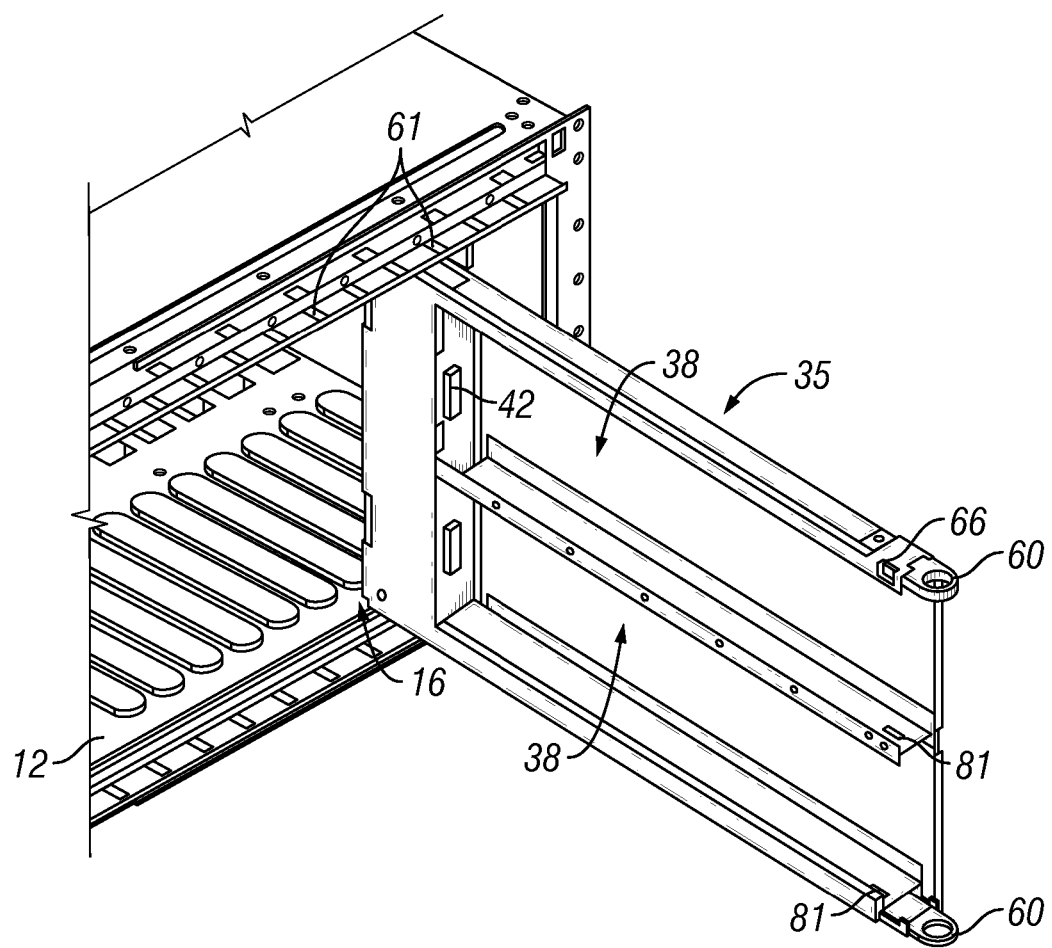
FIG. 4 is a perspective view of an adapter blade 35 aligned with a bay 16 in system chassis 12.

FIG. 4 is a perspective view of an adapter blade 35 aligned with a bay 16 in system chassis 12. The adapter blade 35 is configured to slide into the bay 16 and be selectively secured within the bay 16 in generally the same manner as the server blade 14 in FIG. 3. While the exact latching mechanisms may differ, the adapter blade 35 has compatible overall dimensions to those of a server blade in order to fit within the bay 16 and compatible electronic connectors, typically on the lead end of the adapter blade, in order to connect with a device, such as a midplane, in a similar manner as the server blade 14 in FIG. 3.

A latch 60 is provided at the top and bottom of the exposed end of the adapter blade 35 for selectively securing the adapter blade 35 within the enclosure 12 when fully seated in the bay 16. The latch 60 is secured when the projecting member 66 extends through the slot 61 formed in the system chassis 12. Though compact blades may be slidably inserted into the adapter bays 38 while the adapter blade 35 is outside of the bay 16, the adapter blade 35 in this embodiment is designed to be inserted into the bay 16 "empty" (i.e. without compact blades), prior to inserting the compact blades 32, 34 (shown in FIG. 5) into the adapter blade 35. The latch 60 is preferably designed to prevent inadvertent removal of the adapter blade 35 while compact blades are installed. Accordingly, this embodiment requires the adapter blade 35 to first be inserted and latched into the bay 16 before inserting compact blades into the adapter blade 35. The adapter blade latch 60 is discussed further below.

Figure 5:
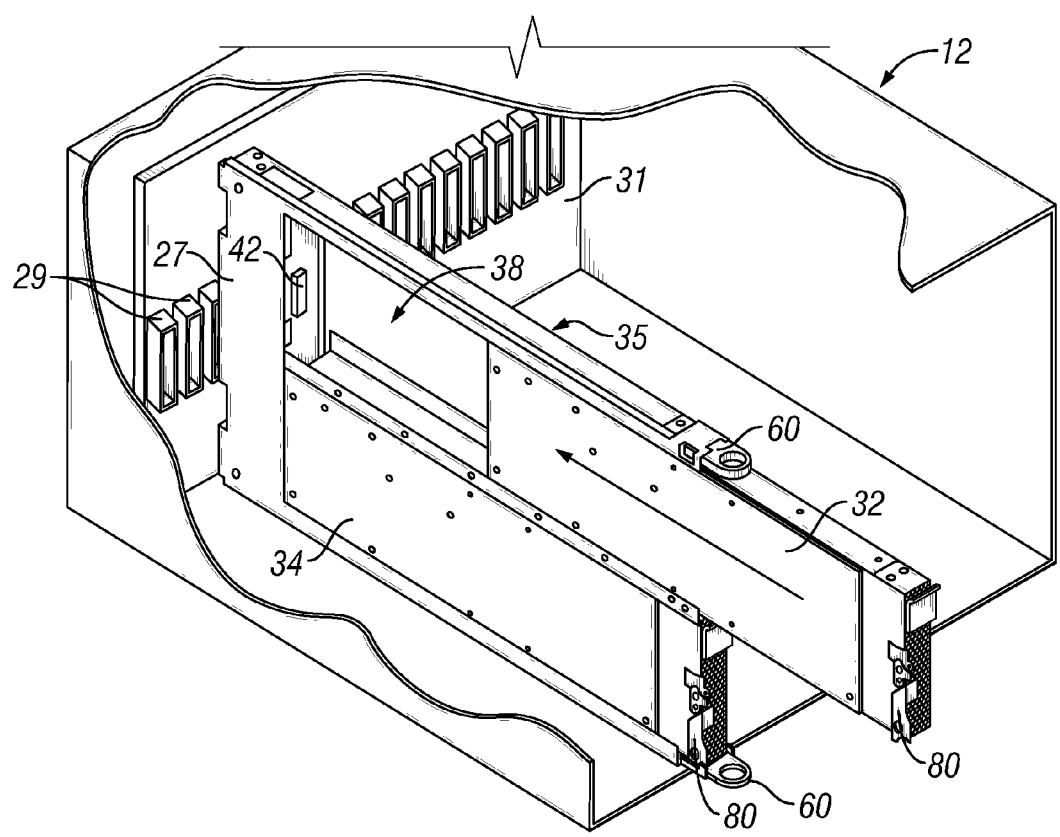
FIG. 5 is a perspective view of an adapter blade slidably insertable in a chassis bay and capable of receiving up to two compact blades.

FIG. 5 is a perspective view of an adapter blade 35 and two compact blades 32, 34. The adapter blade 35 has been inserted and latched into a bay of the system chassis 12 wherein a connector on the leading end of the adapter blade 35 is in electronic communication with a backplane 31 via a connector 29. The adapter blade 35 may slidably receive the two compact blades 32, 34. The compact blades 32, 34 are separate hardware devices each having a processor complex, which may include one or more CPUs, memory modules, PCI cards, and hard drives. The compact blades 32, 34 may be configured as servers, though their compact size relative to a conventional server blade correspondingly limits their complexity. Thus, the compact blades 32, 34 may be suited for configuring as a single-user PC, which typically requires less processing power and complexity than a conventional server. When configured as a single-user PC, a compact blade may be referred to as "client blade" or "blade PC."

The compact blades 32, 34 may be independently positioned in or removed from the adapter bays 38 (See also FIG. 4). In FIG. 5, the compact blade 32 is shown partially inserted into the top bay 38 of the adapter blade 35, and the other compact blade 34 is shown fully inserted into the adapter blade 35. The adapter blade 35 preferably has a form factor similar to the server blade 14 of FIG. 3, so that the adapter blade is constrained similarly to a conventional server blade when disposed within the chassis bay 16. Thus, the adapter blade 35 may optionally be constructed from and/or use some of the same parts as a conventional server blade enclosure. The chassis bay 16, therefore, substantially constrains the adapter blade in terms of lateral (x-axis) translation and vertical (z-axis) translation, but the adapter blade is moveable by the user in a y-axis direction, into and out of the bay 16. The bay 16 also constrains the adapter blade rotationally, fixing its orientation in a substantially parallel relationship with other server blades or adapter blades in adjacent bays. The system chassis 12 thereby constrains the adapter blade 35 and the included compact blades 32, 34 at a fixed spacing and with face-to-face alignment with any adjacent server blades or adapter blades. There may be a slight degree of lateral, vertical, or rotational "play" between the adapter blade and the bay 16 without appreciably affecting the generally fixed spacing and parallel alignment.

A blade release mechanism 80 is provided on each compact blade 32, 34 for selectively securing each of the compact blades 32, 34 within the adapter blade 35 when fully seated within the adapter blade bays 38. The blade release mechanism 80 operates similarly to the conventional release mechanism 24 used for selectively securing the conventional server blade 14 within the bay 16. However, instead of latching directly to the system chassis 12, the compact blades 32, 34 latch to the adapter blade. For example, the latch 80 may selectively extend into a slot 81 formed in the adapter blade bay 38.

Figure 6:
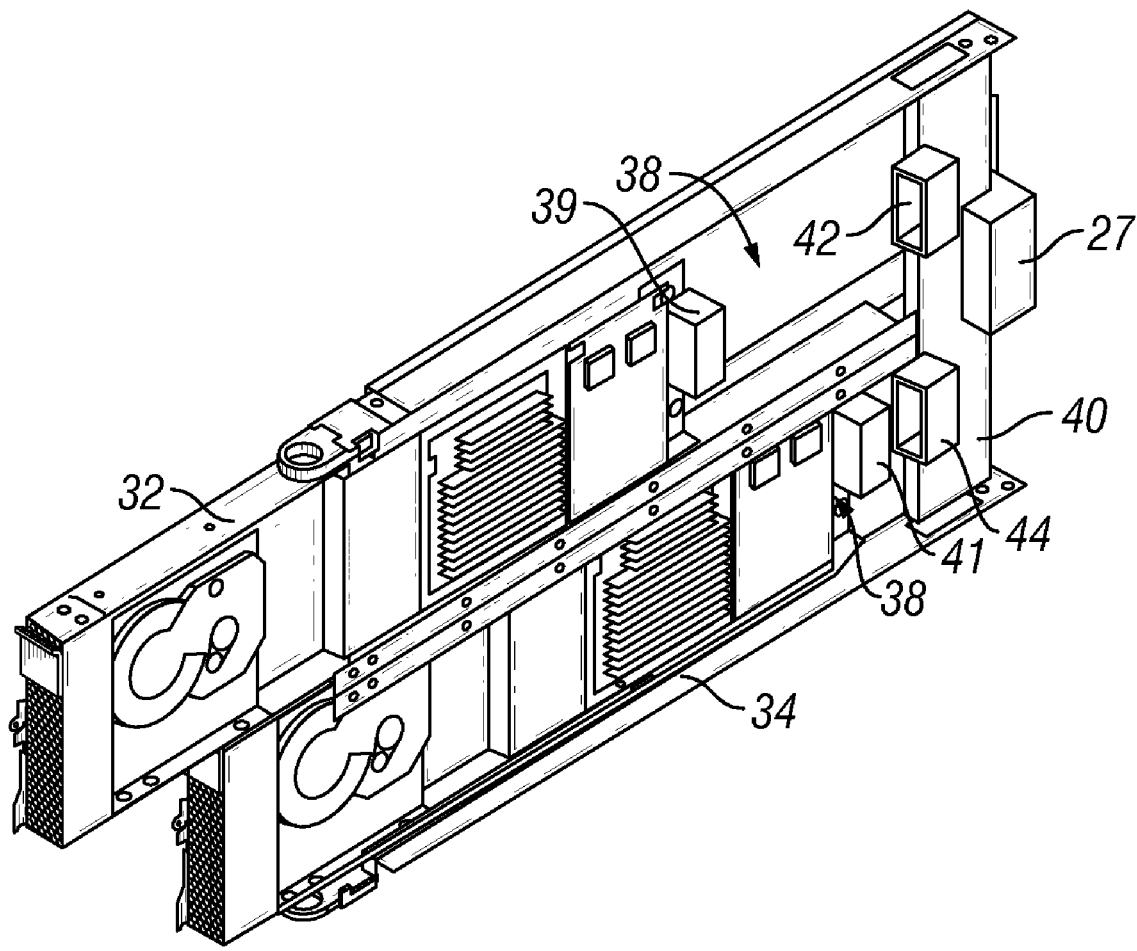
FIG. 6 is a partial cutaway view of an adapter blade with compact blades partially inserted.

FIG. 6 is a partial cutaway view of the compact blades 32, 34 partially inserted into the adapter blade 35. Portions of the adapter blade housing and the compact blade enclosure have been removed to reveal an interposer 40 in the adapter blade and some of the electronic components of the compact blade modules 32, 34. The interposer 40 is a device that electronically couples each of the compact blades 32, 34 with the conventional server interface, such as the backplane 31 of FIG. 5. The interposer 40 connects to the conventional server interface or backplane connector 29 using one or more connectors 27 that optionally provide structural support to or constrain the interposer. In one aspect of the invention, the interposer 40 functions as a multi-device adapter, allowing each of the compact blades 32, 34 to be connected as separate nodes to the conventional server interface. Thus, two client blades (or some other combination of compact blades, such as a client blade and a companion card to the compact blade for retail environments) may now be connected to a processing system as separate nodes even though they are located within a common chassis bay 16, which previously accommodated only a single server blade connected as a single node.

The interposer 40 includes a first compact blade interface 42 for connecting the first compact blade 32 and a second compact blade interface 44 for connecting the second compact blade 34. The hardware interfaces 42, 44 may comprise one or more rigid connectors, but may also include cables or other types of connections. The interposer 40 may be positioned on the adapter blade 35 such that the action of moving the adapter blade 35 into the bay 16 connects the interposer 40 with the conventional server interface. For example, as the adapter blade 35 is inserted into the bay 16 to a fully seated position, connector 27 on the interposer 40 is coupled with connectors 29 on a midplane or backplane 31 (See also FIG. 5). The first and second compact blade interfaces of connectors 42, 44 are positioned in alignment with adapter bays 38 so that respective mating connectors 39, 41 on the leading end of the compact blades 32, 34 can be connected. The action of sliding the first compact blade 32 into the upper adapter bay 38 connects the connector 39 of first compact blade 32 with the first hardware interface 42, and the action of sliding the second compact blade 34 into the lower adapter bay 38 connects the connector 41 of the second compact blade 34 with the second hardware interface 44.

Figure 7:
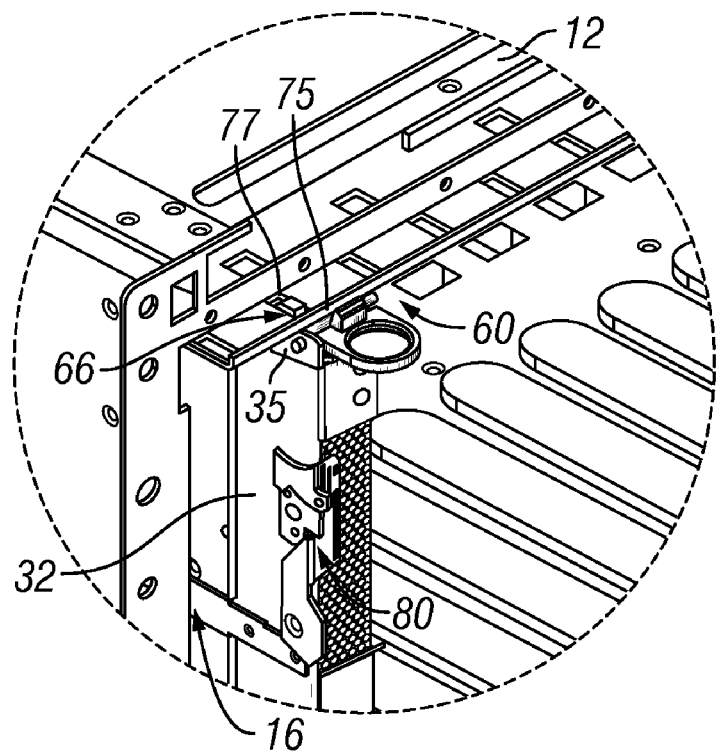
FIG. 7 is a partial perspective view of a system chassis further detailing an adapter blade latch in accordance with the invention.

FIG. 7 is a perspective view of the adapter blade latch 60. FIGS. 7 through 7C provide additional details regarding the operation of the latch 60. The system chassis 12 has a plurality of "1U" type enclosure bays 16. Each enclosure bay 16 may receive either a conventional server blade or the adapter blade 35 according to the invention. The adapter blade 35 is shown fully received and secured (via the adapter blade latch 60) within one of the chassis bays 16. The compact blade 32 is also fully received and secured (via the blade release mechanism 80) within the adapter bay of the fully received and secured adapter blade 35. Though not shown in this figure, the compact blade 34 may be similarly seated and secured within the fully seated and secured adapter blade 35.

Figure 7A:
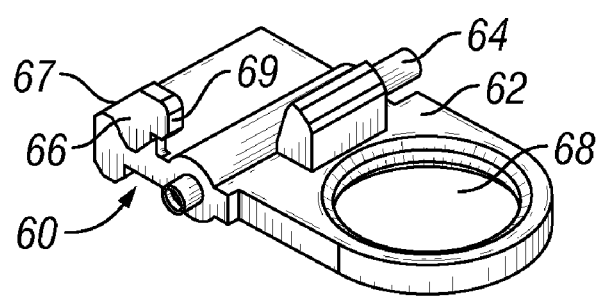
FIG. 7A is a perspective view of a "pull-tab" lever of the adapter blade latch of FIG. 7.

FIG. 7A is a perspective view of the adapter blade latch 60 having a "pull-tab" type lever 62. An aperture 68 on the lever 62 may be sized to accommodate one or more fingers of the user to provide a convenient handle for the user to remove the adapter blade 35 from the enclosure bay 16. The lever 62 is pivotally supported on the adapter blade 35 with a pivot pin 64. The lever 62 also includes a projecting member 66, which in this embodiment is a cam 66 having a ramped edge 67. If the adapter blade 35 is inserted into the bay 16 while the lever 62 is in a horizontal position, the ramped edge 67 will impinge on a lip 75 of the enclosure 12 (See FIG. 7). Assuming the adapter blade 35 is empty, as intended, when inserted into the chassis bay 16 (i.e. with the compact blades 32, 34 not yet inserted into the adapter blade 35), the lever 62 is free to pivot, so that any impingement of the ramped edge 67 on the lip 75 urges the cam 66 downward to provide clearance for the adapter blade 35 to be further inserted to the fully seated position within the bay 74.

As the compact blade 32 is subsequently moved to a fully seated position within the adapter blade 35 (as shown in FIG. 7), the compact blade 32 impinges the lever 62 and causes the lever 62 to rotate upward so that the cam 66 protrudes through a receiving member 77 in the enclosure 12. In this embodiment, the receiving member 77 is a slot, although in another embodiment the receiving member can be another type of opening, a lip, or another projection that the projecting member catches on while the compact blade 32 is inserted, to prevent the adapter blade 35 from being removed from enclosure 12. In yet another embodiment, the lever 62 and projecting member 66 could be disposed on the system chassis 12, and the receiving member or slot could disposed on the adapter blade.

Figure 7B:
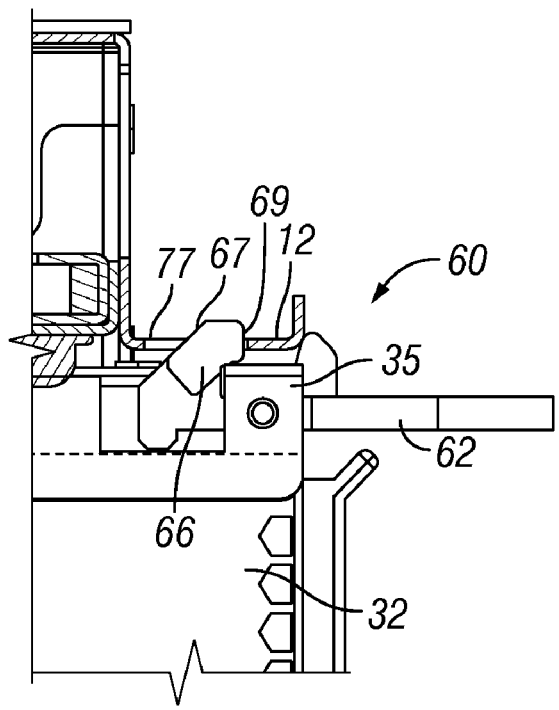
FIG. 7B is a partial side view of the system chassis showing the cam protruding through a slot in the system chassis as a result of positioning the compact blade in the adapter blade.
Figure 7C:
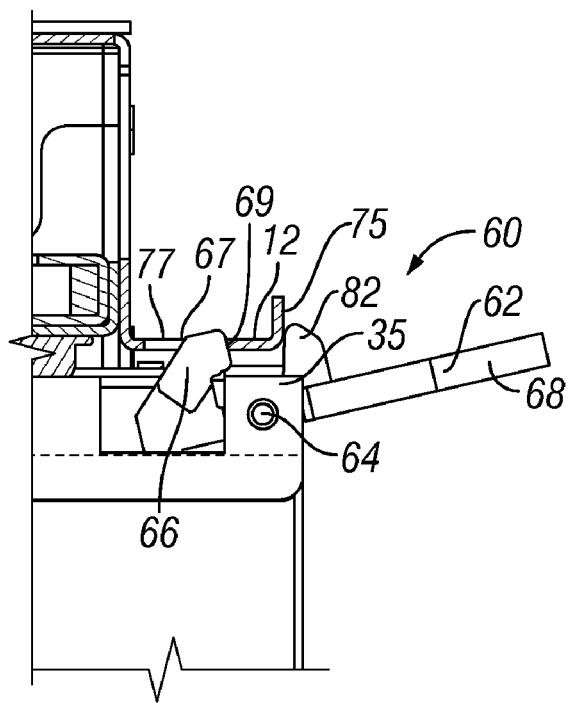
FIG. 7C is another partial side view of the system chassis illustrating how the mechanical advantage of the lever may be used to facilitate the removal of the fully inserted adapter blade.

FIG. 7B is a side view of the latch 60 showing the lever 62 with a cam 66 protruding through the slot 77 in the system chassis 12 as a result of the positioning of the compact blade 32 in the adapter blade 35. The cam 66 includes a locking surface 69 which engages or "catches on" the system chassis 12 to prevent removal of the adapter blade 35 while the cam 66 is disposed in the slot 77. Thus, the latch 60 selectively secures the adapter blade 35 within the chassis bay 16 and must remain latched while the compact blade 32 is installed. The adapter blade 35 may be released by first activating the blade releasing mechanism 80 and removing the compact blade 32, as well as releasing and removing the compact blade 34, if similarly installed. Then, the lever 62 may be pivoted by hand (or possibly by, or with the assistance of, gravity) to move the cam 66 out of the slot 77. A second similar, though inverted latch 60, is preferably employed on the lower edge of the adapter blade 35 as shown in FIG. 4. With the latch(es) released, the adapter blade 35 may then be slid out from the chassis bay 16.

FIG. 7C is another side view of the latch 60 illustrating how the mechanical advantage of the lever 62 may be used both to facilitate the full insertion of the adapter blade 35 in the system chassis 12 and to subsequently facilitate the removal of the fully inserted adapter blade 35. In the first scenario, the adapter blade 35 has been inserted nearly fully into the enclosure 72, slightly short of the fully seated position. Perhaps the connector 27 on the interposer 40 (FIG. 5) is just touching, but not fully engaged with, the connectors 29 on the backplane 31 in the chassis 12. The additional force required to connect the connectors may exceed a force required to slide the adapter blade 35 within the enclosure bay 16. A user may push down on the handle 80 of lever 62 to rotate the lever about the pin 64 and forcibly engage the locking surface 69 with the enclosure 12. The engagement of the locking surface 69 with the enclosure 12 causes the adapter blade 35 to move to its final seated position within the chassis bay 16, connecting the connectors on the interposer with the connectors on the midplane.

In the second scenario, the empty adapter blade 35 may be removed from the system chassis 12. The tight, frictional engagement between the connectors of the interposer with the connectors of the midplane may increase the force required to remove the adapter blade 35 from the system chassis 12. The user may move the handle 80 of lever 62 upward, urging a projection 82 against the lip 75, providing extra mechanical advantage for moving the adapter blade 35 enough to disconnect the interposer connectors with the midplane connectors. Then, the user may optionally pull outward on the lever handle 80, to slide the adapter blade 35 out from the system chassis 12.

Though embodiments of the invention have been described having two compact blades disposed in a single bay, the invention does not limit a processing system to having only two compact blades per bay. In other embodiments, three or more compact blades may be disposed in a single bay and connected to a processing system as separate nodes. Also, the invention does not limit a bay and the associated adapter blade to having a "1U" type of form factor. For example, an adapter blade having bays with a "2U" form factor may be configured to receive more than two compact blades.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus, comprising:
   a system chassis having a plurality of chassis bays, wherein each chassis bay is configured for selectively securing a blade;
   an adapter blade configured to be selectively secured within any of the plurality of chassis bays, wherein the adapter blade includes a plurality of adapter bays, and wherein each adapter bay is configured for selectively securing a compact blade; and
   a blade latch for selectively releasing the adapter blade from the chassis bay, wherein the presence of a compact blade enclosure within any of the plurality of adapter bays of the adapter blade prevents the latch from being operable to release the adapter blade, wherein the blade latch includes a lever pivotally secured to the adapter blade for engaging a mating latch element on the system chassis, and wherein some portion of the lever must enter into an empty adapter bay in order for the lever to release from the mating latch element so that the adapter blade can be removed from the chassis bay.

2. The apparatus of claim 1, wherein the compact blade enclosure includes a latch for selectively releasing the compact blade enclosure from the adapter bay.

3. The apparatus of claim 1, wherein the blade latch is also operable for selectively securing a server blade within the chassis bay.

4. The apparatus of claim 1, wherein the blade latch is disposed along an upper or lower edge of the blade.

5. The apparatus of claim 1, wherein the lever includes a projecting member and the mating latch element is a slot.

6. The apparatus of claim 1, wherein the adapter blade includes a blade latch disposed along an upper edge of the adapter blade and a blade latch disposed along a lower edge of the adapter blade.

7. The apparatus of claim 1, further comprising:
   a server interface disposed for electronic communication with a server blade upon securing the server blade within the chassis bay.

8. The apparatus of claim 7, wherein the server interface is selected from a midplane or a backplane.

9. The apparatus of claim 7, wherein the adapter blade includes an interposer disposed for electronic communication with a compact blade upon securing a compact blade within any of the adapter bays.

10. The apparatus of claim 9, wherein the interposer electronically communicates each compact blade with the server interface as a separate node.

11. The apparatus of claim 1, wherein the compact blade is a blade PC, a companion card to a blade PC, or a blade server.

12. The apparatus of claim 1, wherein the chassis bay and the adapter blade each have a 1U form factor.

* * * * *